(12) United States Patent
Tihanyi

(10) Patent No.: US 6,864,535 B2
(45) Date of Patent: Mar. 8, 2005

(54) CONTROLLABLE SEMICONDUCTOR SWITCHING ELEMENT THAT BLOCKS IN BOTH DIRECTIONS

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/164,178

(22) Filed: Jun. 6, 2002

(65) Prior Publication Data

US 2002/0179925 A1 Dec. 5, 2002

Related U.S. Application Data

(63) Continuation of application No. PCT/EP00/07603, filed on Aug. 4, 2000.

(30) Foreign Application Priority Data

Dec. 6, 1999 (DE) ........................................... 199 58 694

(51) Int. Cl.[7] ......................... H01L 27/01; H01L 27/12; H01L 31/0392
(52) U.S. Cl. ...................................... 257/349; 257/329
(58) Field of Search ................................. 257/107, 326, 257/327, 329, 330, 331, 332, 333, 334, 335, 336, 399, 400, 408, 345

(56) References Cited

U.S. PATENT DOCUMENTS 5,512,770 A * 4/1996 Hong .......................... 257/354
6,064,104 A * 5/2000 Omid-Zohoor et al. ..... 257/510
6,111,296 A * 8/2000 Yamazaki et al. ........... 257/401
6,548,864 B2 * 4/2003 Magri' et al. ................ 257/341

FOREIGN PATENT DOCUMENTS

| EP | 0 323 549 A2 | 7/1989 |
|---|---|---|
| FR | 2 526 587 | 11/1983 |
| JP | 63-177473 | 7/1988 |
| WO | WO 99/17373 | 4/1999 |

OTHER PUBLICATIONS

Jens Peer Stengl et al.: "Leistungs–MOS–FET–Praxis" [power MOSFET in practice], Pflaum Verlag, Munich, 1992, pp. 29–35.

* cited by examiner

Primary Examiner—Long Pham
Assistant Examiner—Dana Farahani
(74) Attorney, Agent, or Firm—Laurence A. Greenberg; Werner H. Stemer; Gregory L. Mayback

(57) ABSTRACT

The controllable semiconductor switching element blocks in both directions. The semiconductor switching element is formed with a first conduction region and a second conduction region of a first type of conductivity, a blocking region of a second type of conductivity which is disposed between the first and second conducting regions, and a control electrode which is arranged opposite the blocking region and insulated from it. A recombination region is configured in the blocking region and is comprised of a material that promotes a recombination of charge carriers of the first and second type of conductivity.

12 Claims, 16 Drawing Sheets

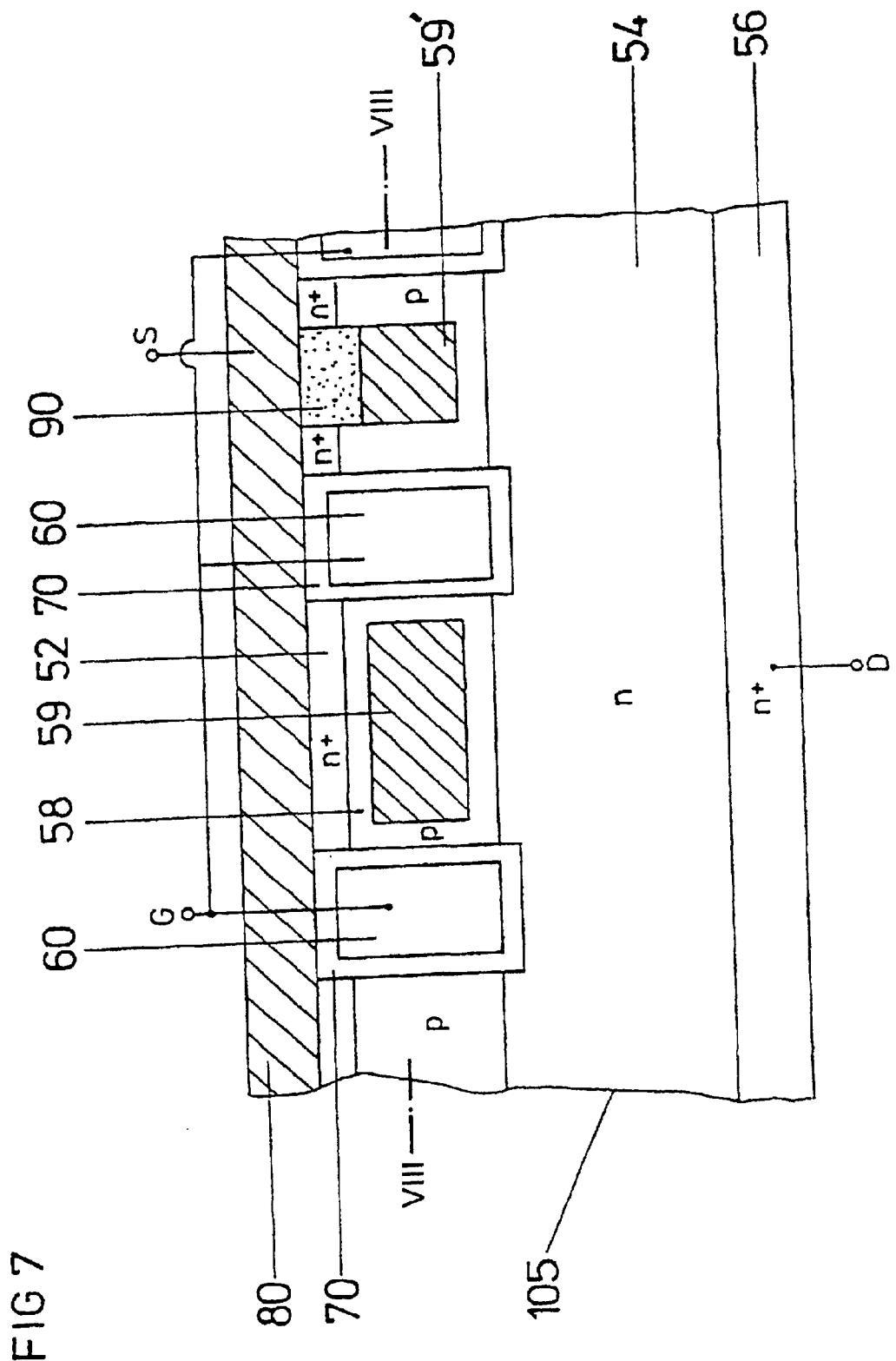

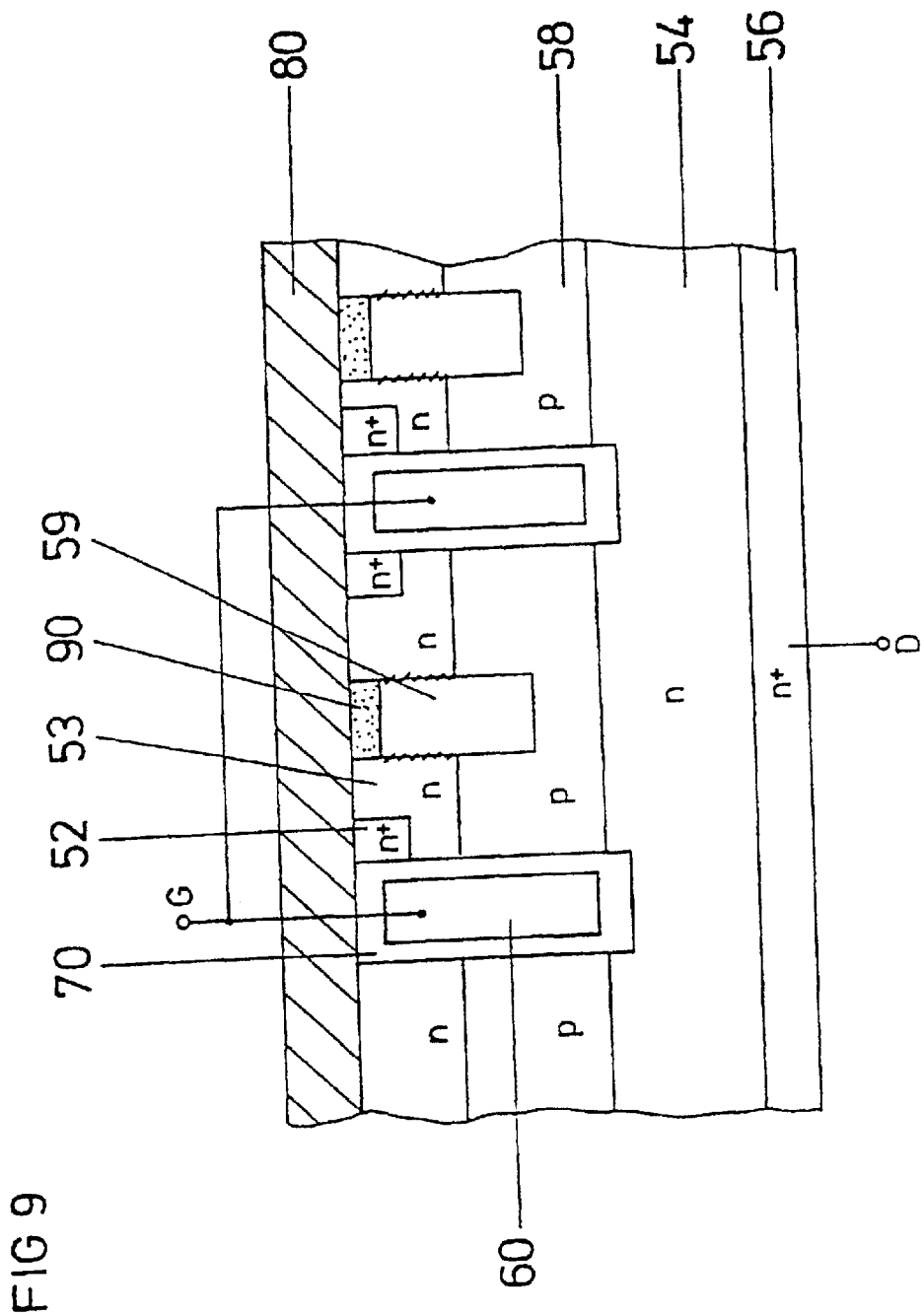

CONTROLLABLE SEMICONDUCTOR SWITCHING ELEMENT THAT BLOCKS IN BOTH DIRECTIONS

CROSS-REFERENCE TO RELATED APPLICATION

This application is a continuation of copending International Application No. PCT/EP00/07603, filed Aug. 4, 2000, which designated the United States and which was not published in English.

BACKGROUND OF THE INVENTION

Field of the Invention

The present invention relates to a controllable semiconductor switching element, in particular a field-effect-controllable semiconductor switching element, having the following features:

a first conduction zone and a second conduction zone of a first conductivity type;

a channel zone of a second conductivity type between the first and second conduction zones; and a control electrode insulated from the channel zone.

Such semiconductor switching elements are, for example, MOSFETs (Metal Oxide Field Effect Transistor) known according to the prior art. One embodiment of a vertical power MOSFET according to the prior art is described in Stengl/Tihanyi: "Leistungs-MOSFET-Praxis" [Power MOSFETs in practice], Pflaum Verlag, Munich, 1992, page 29 et seq., and is partially illustrated in cross section in FIG. 1A. The MOSFET has a source zone as first conduction zone 12 of a first conductivity type (n), which is introduced into a well-like channel zone (also called body zone or depletion zone) of a second conductivity type (p). The source zone 12 can be externally contacted via a source electrode 40, the source electrode 40 reaching through the source zone 12 right into the channel zone and thus short-circuiting the source zone 12 and the channel zone 18.

The channel zone 18 is introduced into a second conduction zone 14, 16 of the first conductivity type (n)—the drain zone of the MOSFET—the second conduction zone having an n-doped zone 14 surrounding the channel zone 18 and a more heavily n-doped zone 16 for connection of a drain electrode. A gate electrode is insulated from the channel zone 18 and the source and drain zones 12, 14. The gate electrode forms a control electrode 20 of the MOSFET above a semiconductor body wherein are formed the source zone 12, which is also designated as forward direction, and the drain zone, which is also designated as reverse direction.

An equivalent circuit diagram of the vertical MOSFET according to FIG. 1A is illustrated in FIG. 1B, which is illustrated as a combination of an ideal MOSFET T1 and a diode Di. The diode is connected in the forward direction between the source terminal S and the drain terminal D of the MOSFET. The diode, which conducts when a positive voltage is applied in the source-drain direction, results from the pn junction between the drain zone 14, 16 and the body zone 18 and the short circuit between the body zone 18 and the source zone 12.

The presence of the integrated diode is disadvantageous for some applications of the MOSFET since it has the effect that the MOSFET only conducts when a forward voltage is applied in the drain-source direction, while it conducts like a diode when a voltage is applied in the source-drain direction.

Without the short circuit between the source zone and the body zone, a parasitic bipolar transistor formed by the sequence of the differently doped zones, namely the source zone of the first conductivity type, the channel zone of the second conductivity type complementary to the first conductivity type and the drain zone of the first conductivity type, would be active in the MOSFET, the base of the bipolar transistor being formed by the channel zone and the emitter/collector of the bipolar transistor being formed by the source zone/drain zone.

FIG. 1C shows the electrical equivalent circuit diagram of a MOSFET without a short circuit between the source zone and the drain zone, which is illustrated as a combination of an ideal MOSFET T1 with a bipolar transistor. The collector/emitter path C-E of the bipolar transistor B1 is connected in parallel with the drain-source path D-S of the MOSFET T1. The base zone of the parasitic bipolar transistor B1 is formed by the channel zone of the MOSFET, the emitter zone is formed by the source zone of the MOSFET and the collector zone is formed by the drain zone of the MOSFET.

The parasitic bipolar transistor B1 influences the dielectric strength of the semiconductor switching element in accordance with FIG. 1C, as shown by the family of characteristic curves of this semiconductor switching element in FIG. 1D. In the case of a drain-source voltage $U_{DS}$ having the value $U_{CE0}$, the collector-emitter breakdown voltage of the parasitic bipolar transistor B1 and thus the maximum reverse voltage of the semiconductor switching element in the drain-source direction D-S are reached. As the gate-source voltage increases, the dielectric strength rises slightly, as can be gathered from the family of characteristic curves. Until the breakdown voltage is reached, the behavior of the semiconductor switching element corresponds to that of an ideal MOSFET.

The reduction of the dielectric strength in a MOSFET with non-short-circuited source zone and depletion zone results from the fact that charge carriers accumulate in the substrate during operation, that is to say when a drive potential is applied to the gate terminal and when a forward voltage is applied between drain and source. These charge carriers drive the base of the parasitic bipolar transistor, as a result of which the latter is turned on. The dielectric strength of such a MOSFET in the drain-source direction is approximately only ⅓ of the dielectric strength of a comparable component with short-circuited source zone and body zone.

SUMMARY OF THE INVENTION

It is accordingly an object of the invention to provide a controllable, dual blocking semiconductor switching element, which overcomes the above-mentioned disadvantages of the heretofore-known devices and methods of this general type and which provides for a controllable semiconductor switching element that blocks in both directions without reduction of the reverse voltage in a main voltage direction (forward direction).

With the foregoing and other objects in view there is provided, in accordance with the invention, a controllable semiconductor switching element, comprising:

a first conduction zone and a second conduction zone of a first conductivity type;

a channel zone of a second conductivity type between the first and second conduction zones;

a control electrode insulated from the channel zone;

the second conduction zone having a more heavily doped second terminal zone for connection to a terminal electrode and a more weakly doped second transition zone adjacent the channel zone;

the first conduction zone having a more heavily doped first terminal zone for connection to a terminal electrode and a more weakly doped first transition zone adjacent the channel zone; and at least one recombination region formed in the channel zone and made of a material promoting a recombination of charge carriers of the first and second conductivity types.

With the above and other objects in view there is also provided, in accordance with the invention, a method for fabricating a semiconductor switching element, which comprises the following steps:

providing a semiconductor body with a second terminal zone of a first conductivity type, a second transition zone of the first conductivity type adjacent the second terminal zone and more weakly doped than the second terminal zone, a channel zone of a second conductivity type adjacent the second transition zone, a first transition zone of the first conductivity type adjacent the channel zone, a first terminal zone of the first conductivity type adjacent the first transition zone and doped more heavily than the second transition zone;

fabricating at least one control electrode surrounded by an insulation layer and extending at least from the first transition zone through the channel zone as far as the second transition zone; and fabricating at least one recombination zone in the channel zone made of a material that promotes a recombination of charge carriers of the first and second conductivity types.

In other words, the objects of the invention are achieved with the novel semiconductor switching element that has at least one recombination region formed in the depletion zone and made of a material which promotes a recombination of charge carriers of the first and second conductivity types. In the semiconductor switching element according to the invention, no short circuit is provided between the channel zone and one of the two conduction zones.

By virtue of the sequence of, arranged next to one another, the first conduction zone of the first conductivity type, the channel zone of the second conductivity type and the second conduction zone of the second conductivity type, a parasitic bipolar transistor is formed in the semiconductor switching element according to the invention. However, the provision of the recombination region in the channel zone of the semiconductor switching element, or in the base zone of the parasitic bipolar transistor, alters the electrical behavior of the parasitic bipolar transistor. When a forward voltage is applied between the first and second conduction zones, charge carriers of the first and second conductivity types, namely holes and electrons, are generated in the space charge zone between one of the two conduction zones and the channel zone. Charge carriers of the first conductivity type can easily recombine with charge carriers of the second conductivity type at the boundary with respect to the recombination region, or at the surface thereof. What is thus achieved by virtue of the recombination zone is that the parasitic bipolar transistor is only driven to a very small extent, or what is achieved is that the parasitic bipolar transistor no longer becomes active when a sufficiently large recombination zone is present.

The dielectric strength of the semiconductor switching element according to the invention thus corresponds in one direction (forward direction) to the dielectric strength of a conventional semiconductor switching element of this type with a short circuit between one of the conduction zones and the channel zone. At the same time, the semiconductor switching element according to the invention also blocks when a forward voltage is applied in the other direction (reverse direction) since there is no short circuit present between one of the conduction zones and the channel zone.

In accordance with an added feature of the invention, the material of the recombination region is preferably a metal. Further embodiments provide for the recombination region to be formed from polysilicon, or a different semiconductor material, or from silicide, or a different corresponding semiconductor compound.

In accordance with an additional feature of the invention, the recombination region is formed in a plate-type manner in order to provide, in conjunction with a small volume, a surface that is as large as possible for the recombination of the charge carriers. The semiconductor switching element according to the invention is preferably constructed in a cell-like manner, that is to say a multiplicity of identically constructed and driven cells are present which each have a first conduction zone, a channel zone and a second conduction zone. In this case, each cell has a recombination region.

It is possible to form a plurality of recombination regions, which are formed in particular in a plate-type or strip-type manner, spaced apart from one another in the channel zone, preferably in the channel zone of each cell. In this case, the individual recombination regions are preferably connected to one another by heavily doped regions of the second conductivity type in order to enable an easy exchange of charge carriers between the recombination regions, or the various sections of the recombination region that are arranged separately from one another.

In addition to embodiments wherein the recombination regions are completely surrounded by the channel zone, that is to say a zone made of material of the second conductivity type, further embodiments of the invention provide for the recombination regions to be connected to the first conduction zone by zones made of material of the first conductivity type. When a metal or a silicide is used as material for the recombination region, a Schottky contact is produced between the depletion zone, which is also designated as body zone in MOSFETS, and the first conduction zone, the Schottky contact determining the dielectric strength of the component in the reverse direction.

In accordance with a further embodiment of the invention, the first conduction zone has a heavily doped terminal zone for connection of a first terminal electrode and a more weakly doped transition zone between the terminal zone and the channel zone, and the second conduction zone has a heavily doped second terminal zone for connection of a second electrode and a more weakly doped second transition zone arranged between the second terminal zone and the channel zone. The dielectric strength of the semiconductor switching element according to the invention is essentially determined by the doping of the transition zones and the distance between the terminal zones and the channel zone, the distance being determined by the transition zones. In this embodiment, wherein each conduction zone has a more weakly doped transition zone, a dielectric strength of the semiconductor switching element that is approximately identical in the forward direction and in the reverse direction can be set by means of the thickness and the doping of the transition zones.

Other features which are considered as characteristic for the invention are set forth in the appended claims.

Although the invention is illustrated and described herein as embodied in a controllable semiconductor switching element that blocks in both directions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 7 shows a detail from a semiconductor switching element according to the invention in accordance with a third embodiment in cross section;

FIG. 9 shows a detail from a semiconductor switching element according to the invention in accordance with a fourth embodiment in cross section;

Unless specified otherwise, identical reference symbols designate structurally identical and functionally equivalent parts and regions throughout the figures.

DESCRIPTION OF THE PREFERRED EMBODIMENTS

Figure 1A:
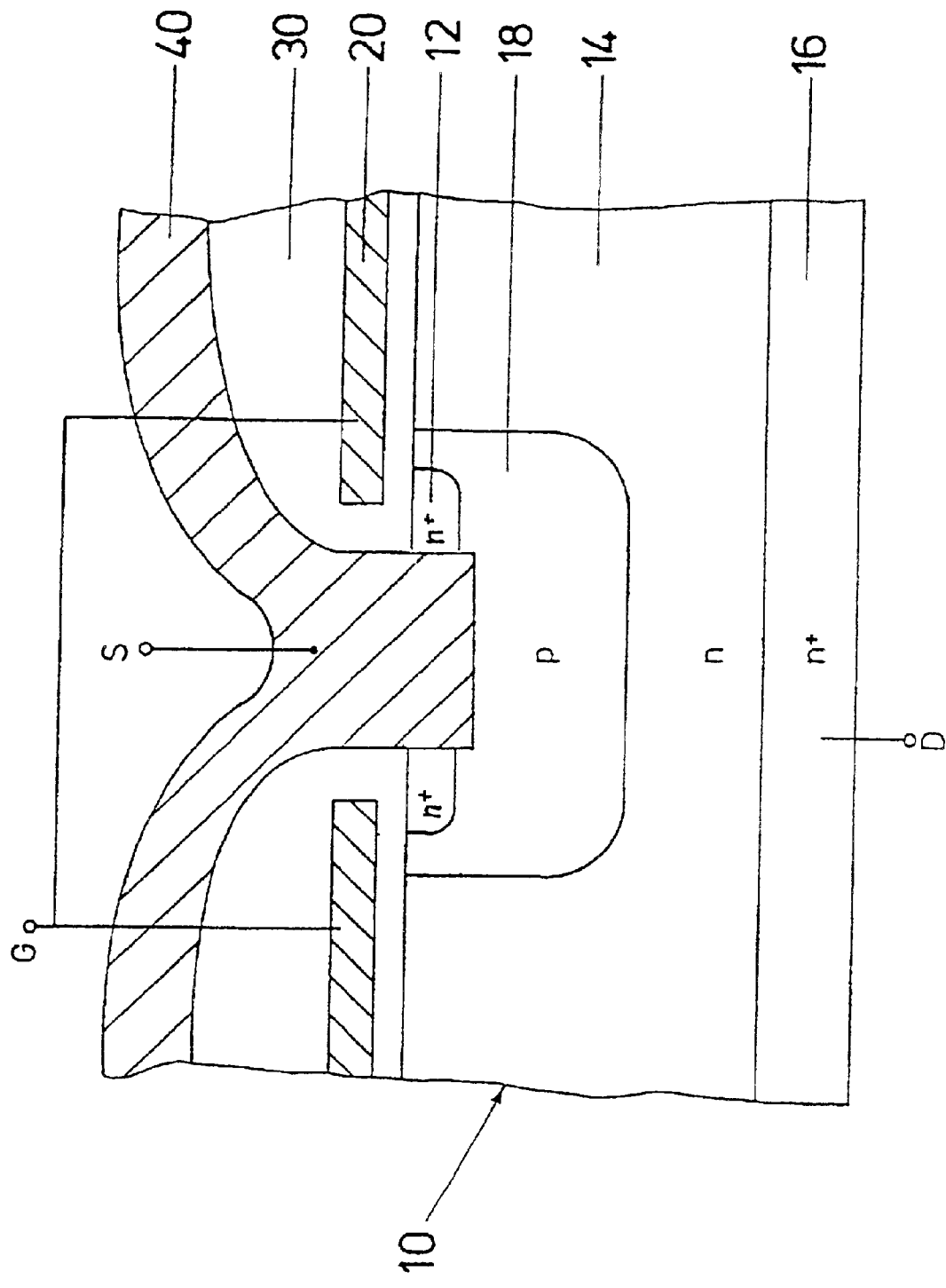
FIG. 1 shows a MOSFET according to the prior art in cross section (FIG. 1A) and its equivalent circuit diagram (FIG. 1B), equivalent circuit diagram (FIG. 1C) and family of characteristic curves (FIG. 1D) of a MOSFET without a short circuit between the source region and body region.
Figure 1C:
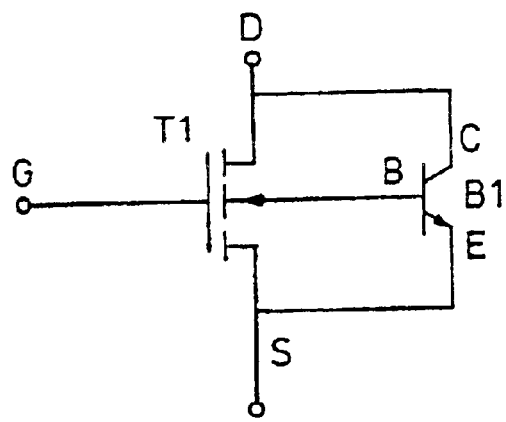
Figure 1B:
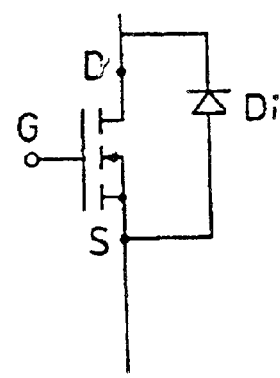
Figure 1D:
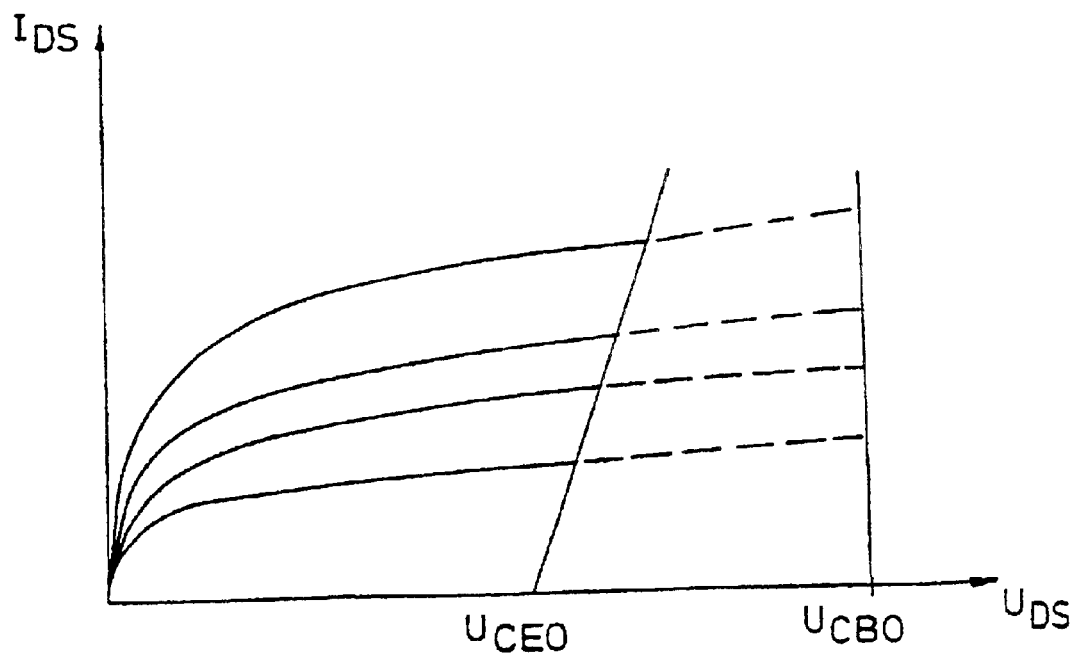
Figure 2:
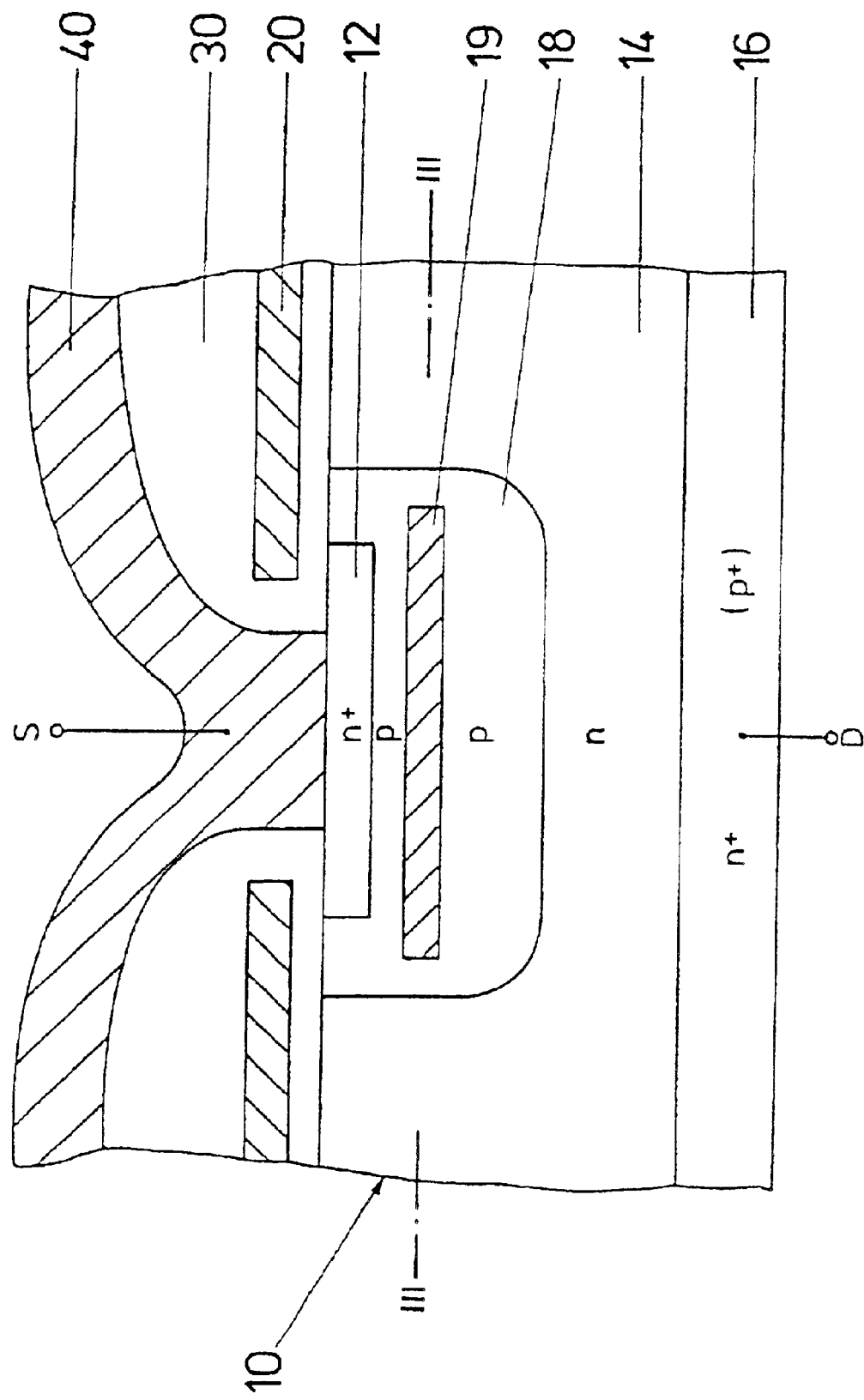
FIG. 2 shows a detail from a semiconductor switching element according to the invention in accordance with a first embodiment in cross section.

Referring now once more to the figures of the drawing in detail, and particularly to FIG. 2 thereof, there is shown a cross section through a detail from a semiconductor switching element according to the invention in accordance with a first embodiment. The semiconductor switching element illustrated has the construction of a vertical n-conducting MOS transistor, in particular of an n-conducting MOSFET. In this case, in an n-conducting semiconductor body 10, a p-conducting zone is formed as channel zone 18, which is also designated as body zone or depletion zone, into which, in turn, a highly doped n-conducting zone 12 is introduced, which serves as first conduction zone, or source zone, of the MOSFET. The semiconductor body 10 has an n-conducting region 14 and, in the region of a side remote from the source zone, a highly doped n-conducting region 16, which together form the second conduction zone, or drain zone. The heavily doped region 16 serves for connection to a drain electrode D.

The source zone 12 is connected to a source electrode 40, S, for example made of aluminum, the source electrode 40 making contact with the source zone at a surface of the semiconductor body 10. At least one gate electrode 20, which serve as control electrode of the MOSFET, are arranged above the depletion zone 12 and in a manner isolated from the latter by an insulation layer 30. The gate electrode 20 is composed of polysilicon, for example, and the insulation layer 30 is composed of a silicon oxide, for example. The structure illustrated is preferably repeated a number of times toward the left and right and perpendicularly to the plane of the drawing, thereby producing a cell-like structure of the semiconductor switching element. The current-carrying strength of the semiconductor switching element rises with the number of cells.

The MOSFET illustrated has a parasitic bipolar transistor, the emitter zone thereof being formed by the source zone 12, the base zone thereof being formed by the channel zone 18 and the collector zone thereof being formed by the drain zone 14, 16 of the vertical MOSFET.

A recombination zone 19 made of a material that promotes the recombination of n-type charge carriers and p-type charge carriers in this zone is arranged in the channel zone 18 of the MOSFET, or the base zone of the parasitic bipolar transistor. The recombination zone is preferably composed of a metal, a polysilicon or a silicide and is formed in a plate-type manner, for example.

If, in the semiconductor switching element according to the invention, a positive voltage is applied between the drain zone 14, 16, or a drain electrode which is applied to the zone 16 and is not illustrated in any greater detail, and the source zone 12, or the source electrode 40, charge carriers, namely electrons and holes, are generated in the space charge zone between the drain zone 14 and the channel zone 18. In this case, on account of the field in the space charge zone, the holes flow into the drain zone 14, 16, and the holes flow into the depletion zone. A recombination of the injected holes with electrons takes place to an intensified extent at the surface of the recombination region 19, thereby preventing the parasitic bipolar transistor from becoming active and reducing the reverse voltage in the drain-source direction.

In other words: the good possibility of recombination of n-type and p-type charge carriers in the base zone of the parasitic bipolar transistor reduces the current gain $\beta$ thereof and thereby increases the collector-emitter breakdown voltage thereof, which concomitantly determines the dielectric strength of the MOSFET over the drain-source path.

For the rest the illustrated semiconductor switching element functions like a MOSFET, that is to say that when a positive drive potential is applied to the gate electrode 20, a conductive channel forms in the channel zone between the source zone 12 and the drain zone 14, which channel, when a forward voltage is applied between the drain zone 16 and the source electrode 14, enables a current flow between the drain terminal D and the source terminal S.

Through a suitable choice of the material and the geometrical structure of the recombination region 19, the breakdown voltage of the MOSFET can be increased to the extent that would result in the event of a short circuit between the first conduction zone (source zone) 12 and the channel zone 18, i.e. in the event of a short-circuited base-emitter junction of the parasitic bipolar transistor, but without having to accept the disadvantageous effect of such a short circuit, namely the lack of dielectric strength in the reverse direction (source-drain direction). The MOSFET illustrated blocks even when a positive voltage is applied between the source electrode 40, or the source zone 12, and the drain zone 14, 16 in a manner governed by the pn junction between the depletion zone 18 and the source zone 12.

As is indicated in FIG. 2, the region 16 can be heavily p-doped instead of heavily n-doped. The semiconductor switching element then functions as an IGBT (Insulated Gate Bipolar Transistor).

The recombination region 19 is preferably formed in such a way that it has a large area in conjunction with a small volume requirement.

Figure 3:
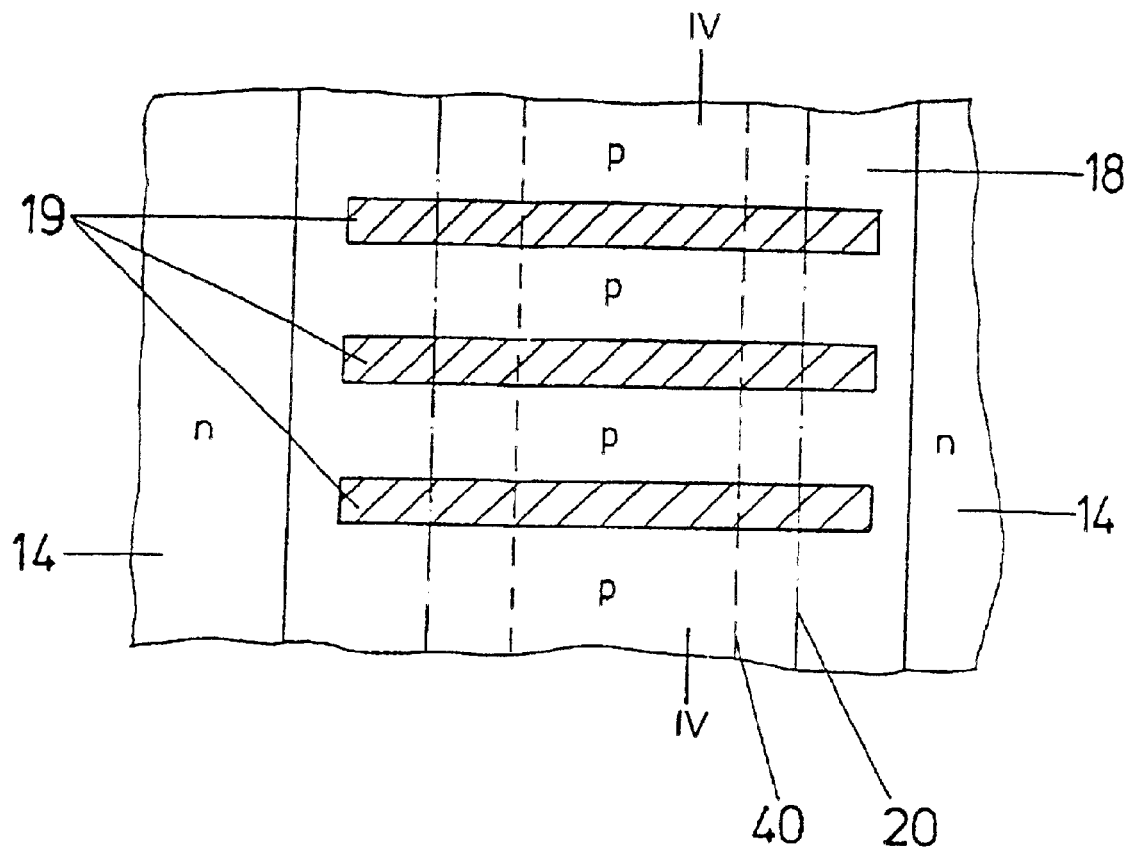
FIG. 3 shows a cross section through the semiconductor switching element in accordance with FIG. 2 along a line III—III.

The recombination region is therefore preferably formed in a plate-type manner, or, as is illustrated in FIG. 3 using a cross section along the line III—III from FIG. 2, from a plurality of strip-type sections which essentially run parallel. The dash-dotted lines in FIG. 3 illustrate the position of the overlying gate electrode 20. The dashed lines illustrate the position of the overlying source electrode 40, S.

Figure 4:
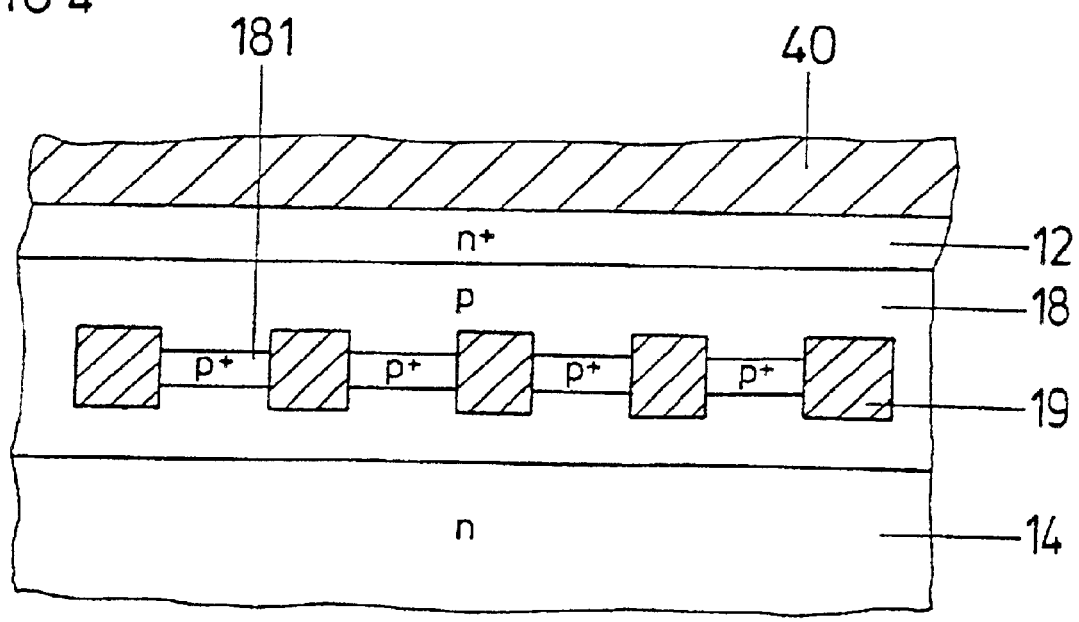
FIG. 4 shows a cross section through the semiconductor switching element in accordance with FIGS. 2 and 3 along a line IV—IV in FIG. 3.

FIG. 4 shows a cross section through the semiconductor switching element along a sectional line IV—IV depicted in FIG. 3, from which the parallel position of the strips forming the recombination region 19 becomes clear. The individual subregions of the recombination region 19 are preferably connected to one another by heavily p-doped regions 181 in order to promote the charge exchange between the subregions of the recombination region 19.

Figure 5:
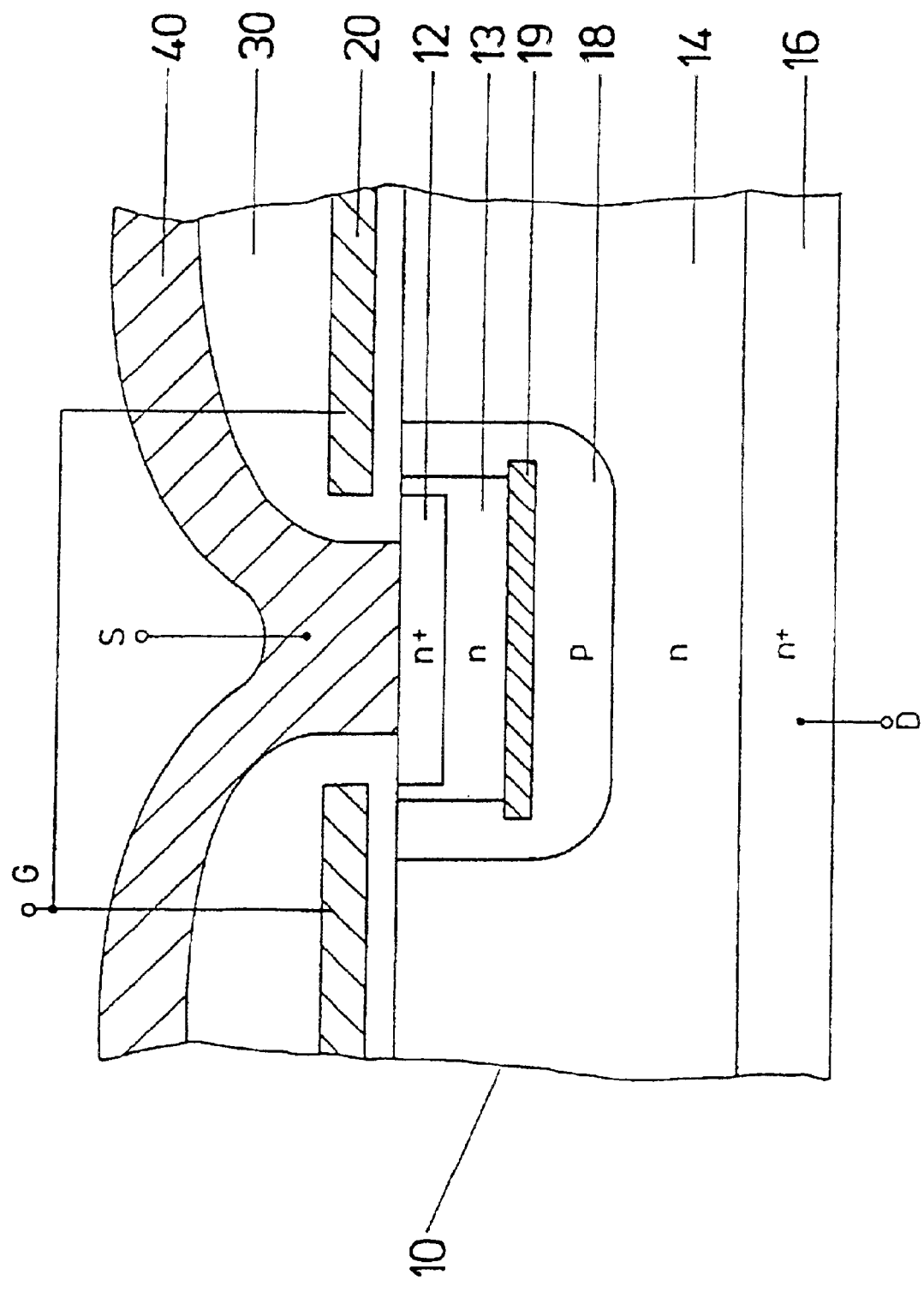
FIG. 5 shows a detail from a semiconductor switching element according to the invention in accordance with a second embodiment in cross section.

FIG. 5 shows a further embodiment of the semiconductor switching element according to the invention, the recombination region 19 and the heavily n-doped source zone 12 being connected to one another by an n-conducting zone 13. The material of the recombination region 19 is preferably a metal or a silicide in this embodiment.

Figure 6:
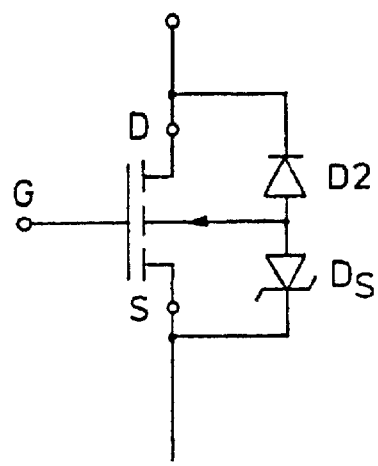
FIG. 6 shows an equivalent circuit diagram of the semiconductor switching element in accordance with FIG. 5.

FIG. 6 shows the equivalent circuit diagram of the semiconductor switching element according to FIG. 5. A Schottky junction is formed between the n-conducting region 13, which is part of the source zone, and the recombination region 19, said Schottky junction being depicted as Schottky diode $D_S$ between the source terminal S and the substrate terminal of the MOSFET. The diode D2 between the drain terminal D and the substrate terminal is formed by the pn junction between the drain zone 14, 16 and the depletion zone 18 (also referred to as p-type body region). The Schottky diode $D_S$ determines the reverse voltage of the semiconductor switching element in the reverse direction (source-drain direction), and the diode D2, or the pn junction between the drain zone 14, 16 and the depletion zone 18, determines the dielectric strength of the MOSFET in the forward direction (drain-source direction).

Figure 8:
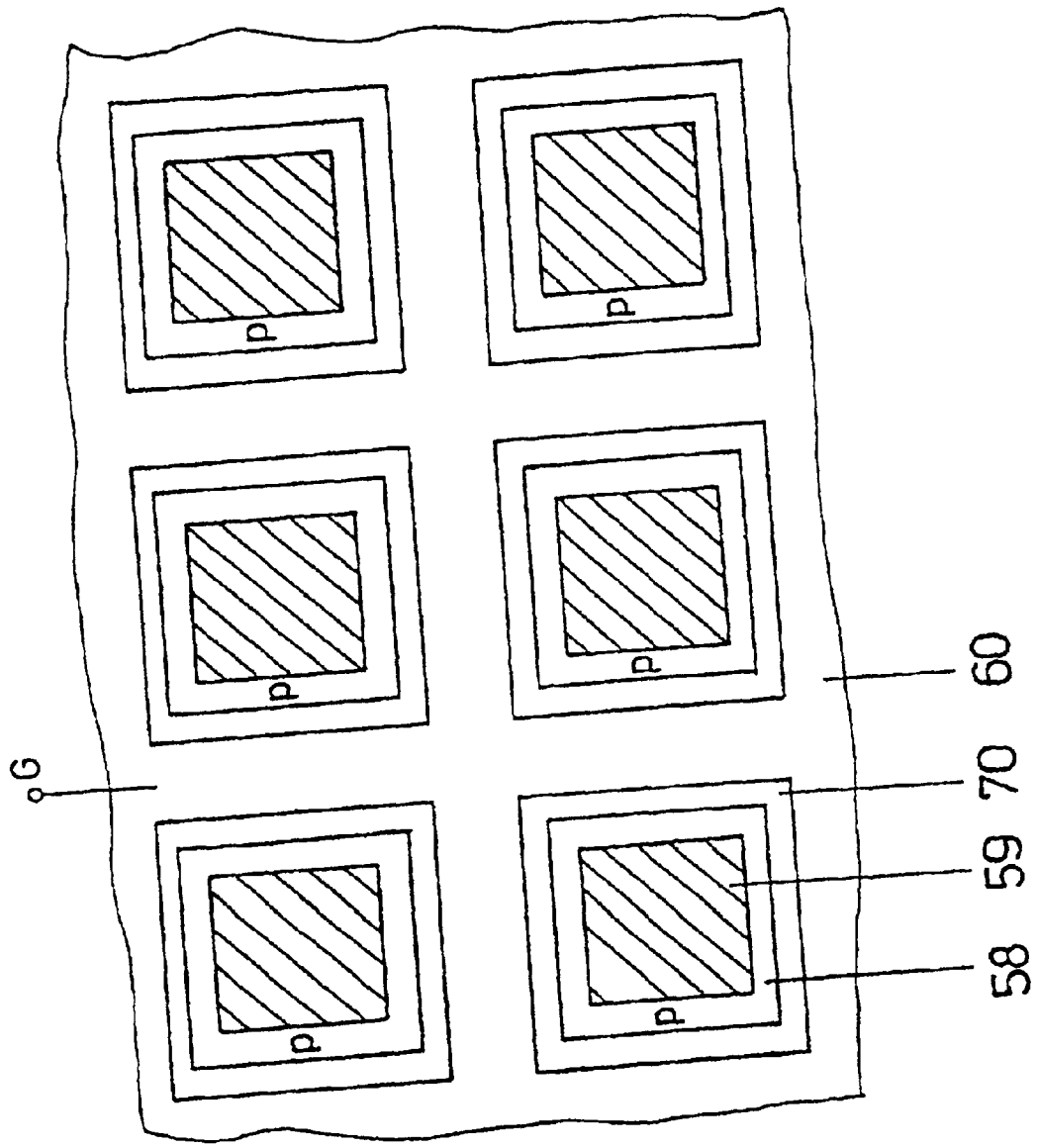
FIG. 8 shows a cross section through the semiconductor switching element in accordance with FIG. 7 along a line VIII—VIII.

FIG. 7 partially shows a cross section through a semiconductor switching element in accordance with a further embodiment of the invention. FIG. 8 shows a cross section through this semiconductor switching element along the sectional line VIII—VIII depicted in FIG. 7. In this embodiment, a gate electrode 60 is arranged in a "buried" manner in a semiconductor body 105 and is surrounded by an insulation layer 70. A source electrode 80 terminates the semiconductor body 101 toward the top. First heavily n-doped conduction zones (source zones) 52 are arranged below the source electrode 80 and between the trench structure of the gate electrode 60. The source zones 52 are adjoined by p-doped depletion zones 58 wherein are arranged recombination regions 59 made of a material which promotes the recombination of n-type and p-type charge carriers. The structure comprising gate electrode 60 and surrounding insulation layer 70 extends downward as far as an n-doped zone 54 which, together with an adjoining heavily n-doped zone 56, forms a second conduction zone (drain zone) of the MOSFET illustrated.

In addition to an exemplary embodiment of a recombination region 19 which is completely surrounded by the p-conducting channel zone 58, FIG. 7 shows an exemplary embodiment of a recombination region 59' which is insulated by an insulation layer 90 from the source electrode 80, S and the source zone 52. This results from a possible fabrication method of the recombination zone 59' in the depletion zone. In this case, before the deposition of the source electrode 80, holes are introduced into the depletion zone 58, for example by etching, and subsequently filled to a height below the source zone 52 with a material which promotes the recombination. Afterward, the insulation layer 90 is applied in the hole above the material which promotes the recombination.

As becomes clear in particular from the plan view in FIG. 8, the semiconductor switching element according to the invention in accordance with FIG. 7 has a grid-type gate electrode 60, the channel zone 58 with the recombination zone 59, which is insulated from the gate electrode 60 by an insulation layer 70, being arranged in interspaces of the grid. The semiconductor switching element thus has a multiplicity of identically constructed cells which are driven simultaneously, the current-carrying strength of the semiconductor switching element according to the invention rising with the number of cells. When a positive drive potential is applied to the gate electrode 60, a conductive channel forms in the channel zone in the vertical direction of the semiconductor body 105 along the gate electrode 60, a current flow between the drain electrode D and the source electrode S being enabled when a forward voltage is applied between the drain electrode D and the source electrode S.

FIG. 9 partially shows in cross section a further embodiment of a semiconductor switching element according to the invention with a trench-type structure comprising gate electrode 60 and insulation layer 70. In this embodiment, the source zone comprises a heavily n-doped zone 52 arranged adjacent to the gate electrode 60 and the source electrode 80, and a normally n-doped zone 53 which surrounds the heavily doped zone 52 in the remaining regions. In this embodiment, the recombination region 59 extends from the p-doped depletion zone 58 arranged below the zone 53 right into the n-doped zone 53 and is insulated toward the top from the source electrode 80 by an insulation layer 90. In this embodiment, the recombination region 59 is preferably composed of a metal or a silicide and forms a Schottky contact with the n-doped zone 53. The equivalent circuit diagram of the semiconductor switching element according to FIG. 9 corresponds to that illustrated in FIG. 6.

While a conductive channel forms in the lateral direction in the depletion zone 18 when a positive voltage is applied between the gate and source electrodes G, S and a positive voltage is applied between the drain and source electrodes D, S in the case of the semiconductor switching elements illustrated in FIGS. 2 to 6, a conductive channel forms in the vertical direction in the case of the exemplary embodiments according to FIGS. 7 and 8. This embodiment saves more space relative to the embodiments illustrated in FIGS. 2 to 6.

If the heavily n-doped zone 56 is replaced by a heavily p-doped zone, the components illustrated in FIGS. 7 to 9 function as IGBTs.

Figure 10:
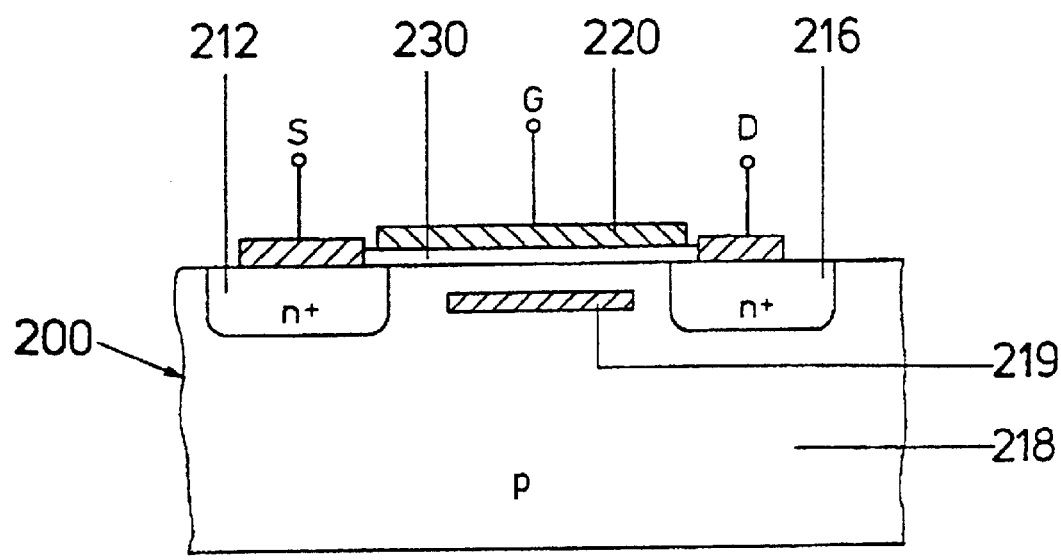
FIG. 10 shows a semiconductor switching element according to the invention in a lateral design.

FIG. 10 shows a further embodiment of a semiconductor switching element according to the invention, which is formed as a MOSFET in a lateral design. In this case, heavily n-doped drain and source zones 216, 212 are arranged in a p-doped depletion zone 218 of the semiconductor body 200 and can be contact-connected by means of source and drain electrodes S, G from the same side of the semiconductor body 200. A gate electrode G is arranged in a manner insulated by an insulation layer 230 on the semiconductor body 200. A recombination region made of a material which promotes the recombination of n-type and p-type charge carriers is arranged in the depletion zone 218.

Figure 11:
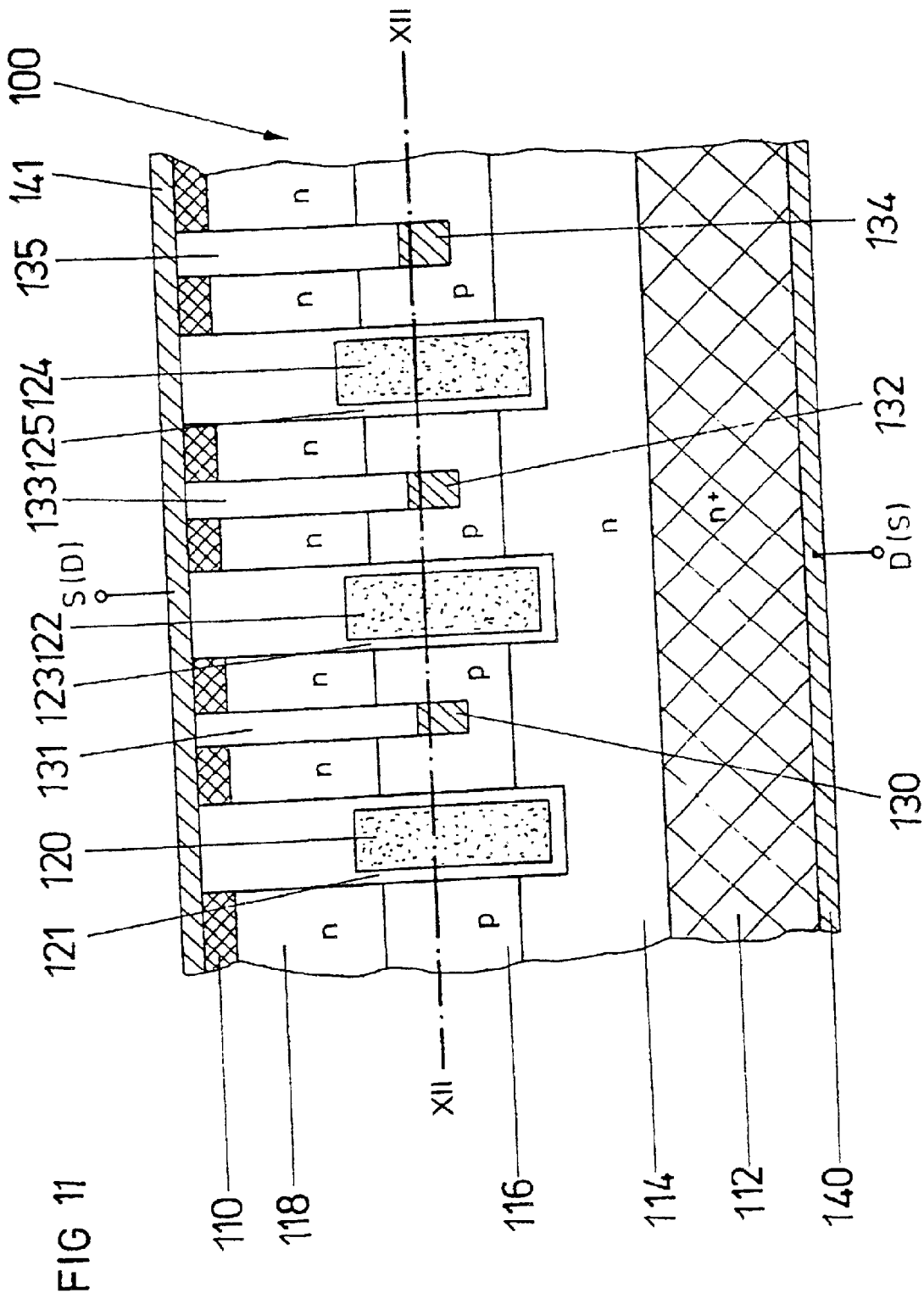
FIG. 11 shows a cross section through a semiconductor switching element according to the invention in accordance with a further embodiment in side view.
Figure 12:
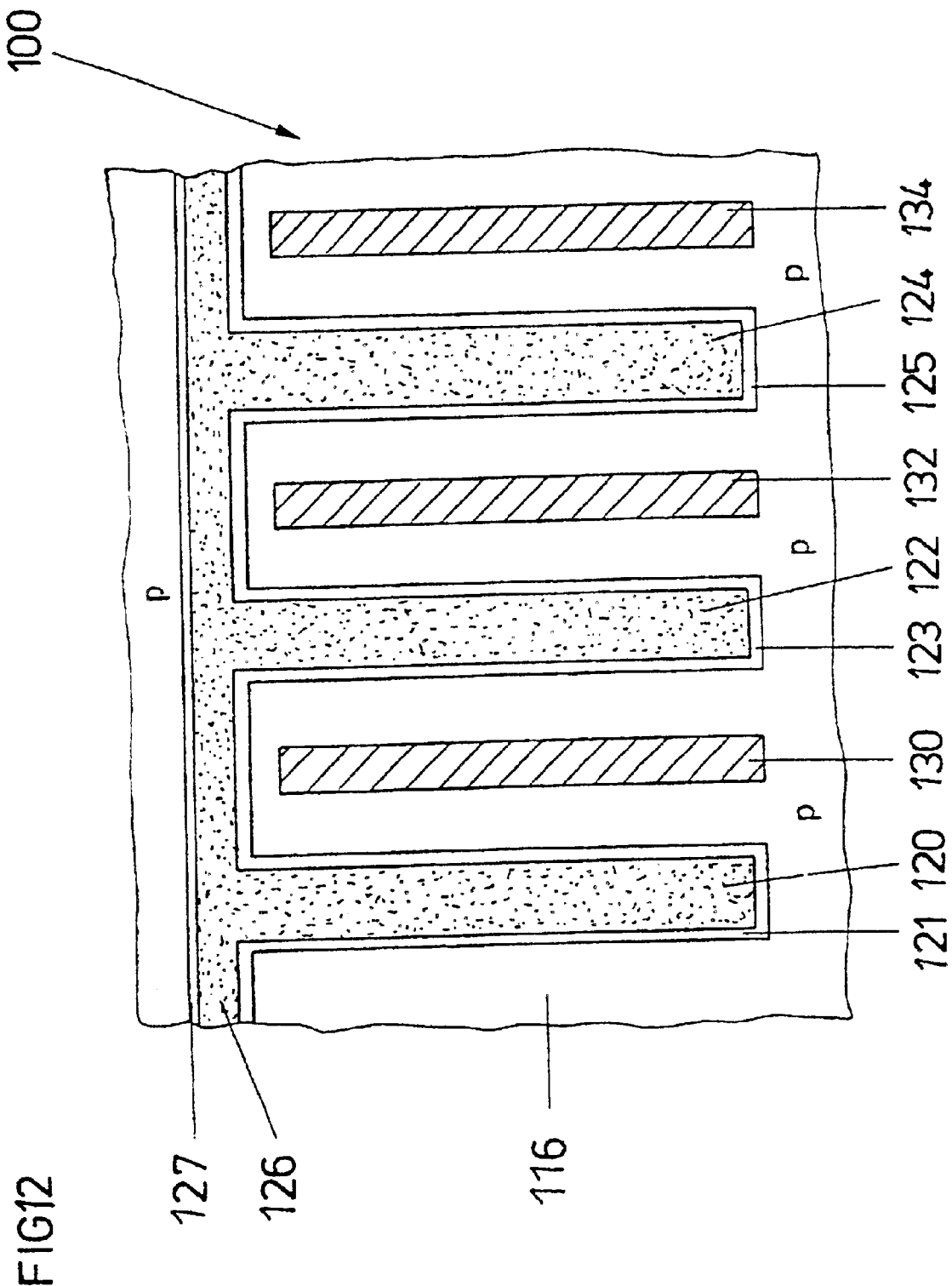
FIG. 12 shows a cross section through the semiconductor switching element according to FIG. 11 in cross section along the sectional plane XII—XII.

FIG. 11 shows a further exemplary embodiment of a semiconductor switching element according to the invention which blocks in both directions, in side view in cross section. FIG. 12 illustrates a cross section through the arrangement according to FIG. 11 along the sectional plane XII—XII.

The semiconductor switching element according to the invention has a semiconductor body 100 having a heavily n-doped second terminal zone 112 and an n-doped second transition zone 114, which is arranged adjacent to the second terminal zone 112 and is doped more weakly than the second terminal zone 112, the second terminal zone 112 and the second transition zone 114 forming a second conduction zone (drain zone) of the semiconductor switching element. A p-doped channel zone 116 is formed adjacent to the second transition zone 114, which channel zone is not necessarily doped homogeneously and is adjoined by an n-doped first transition zone 118. A heavily n-doped first terminal zone 110 is formed adjacent to the first transition zone 118 and is doped more heavily than the first transition zone 118, the first terminal zone 110 and the first transition zone 118 forming a first conduction zone (source zone) of the semiconductor switching element. In the exemplary embodiment, the second terminal zone 112, the second transition zone 114, the channel zone 116, the first transition zone 118 and the first terminal zone 110 are arranged in a layer-like manner one above the other, a second terminal electrode 140, preferably made of metal or polysilicon, being applied to a rear side of the semiconductor body 100 for contact-connection of the second terminal zone 112, and a first terminal electrode 141 being applied to a front side of the semiconductor body for contact-connection of the first terminal zone 110.

When a positive drive potential is applied to the gate electrode, in this semiconductor switching element, a conductive channel forms along the surface of the semiconductor body between the source zone 212 and the drain zone 216. In this embodiment, too, n-type charge carriers and p-type charge carriers can recombine with one another at the recombination zone 219, thereby preventing a parasitic bipolar transistor formed by the sequence of the n-conducting source zone 212, the p-conducting channel zone 218 and the n-conducting drain zone 216 from being driven.

The second terminal zone 112 and the adjoining second transition zone 114 form the drain zone of the MOSFET; the first terminal zone 110 and the adjoining first transition zone 118 form the source zone of the MOSFET, the drain and source terminals being interchangeable on account of the symmetrical construction of the FET illustrated in FIG. 11.

In order to enable the formation of a conductive channel in the channel zone between the drain zone 112, 114 and the source zone 110, 118, a control electrode 120, 122, 124, 126 is provided, which is surrounded by an insulation layer 121, 123, 125, 127 and extends in the vertical direction of the semiconductor body 100 from the n-doped first transition zone 114 through the p-doped channel zone 116 right into the n-doped second transition zone 118. As can be seen from FIG. 12, in the exemplary embodiment, a number of approximately parallel control electrodes 120, 122, 124 are provided, which are connected by a common plate 126, as a result of which the control electrodes 120, 122, 124 can be connected to a common drive potential. The common plate is insulated from the semiconductor body 100 by an insulation layer 127 and extends in the vertical direction preferably as far as the front side or rear side of the semiconductor body 100 in order to be connected to a drive potential. The first and/or second terminal zone 110, 112 preferably does not extend as far as the common plate 126, in order to prevent the formation of a current-carrying channel along the common plate 126. It goes without saying that, in addition to the common plate 126, any other embodiments desired are conceivable in order to connect the control electrodes 120, 122, 124 to a common drive potential.

The more control electrodes 120, 122, 124 are provided in the semiconductor body 100, the larger the electrode area along which a current-carrying channel can form, and the larger the current-carrying strength of the MOSFET.

The regions made of insulation material above the control electrodes 120, 122, 124 and below the terminal electrode 141 are produced by filling the trenches wherein the control electrodes 120, 122, 124 are formed with insulation material after the fabrication of the control electrodes 120, 122, 124.

According to the invention, recombination zones 130, 132, 134 are provided in the channel zone 116 adjacent to the control electrodes 120, 122, 124, which recombination zones promote the recombination of n-type and p-type charge carriers in the channel zone 116. The recombination zones 130, 132, 134 are preferably composed of a metal, such as platinum for example, or of a silicide. The distance between the recombination zones 130, 132, 134 and the control electrodes is preferably small and is preferably less than 5 $\mu$m.

Figure 13:
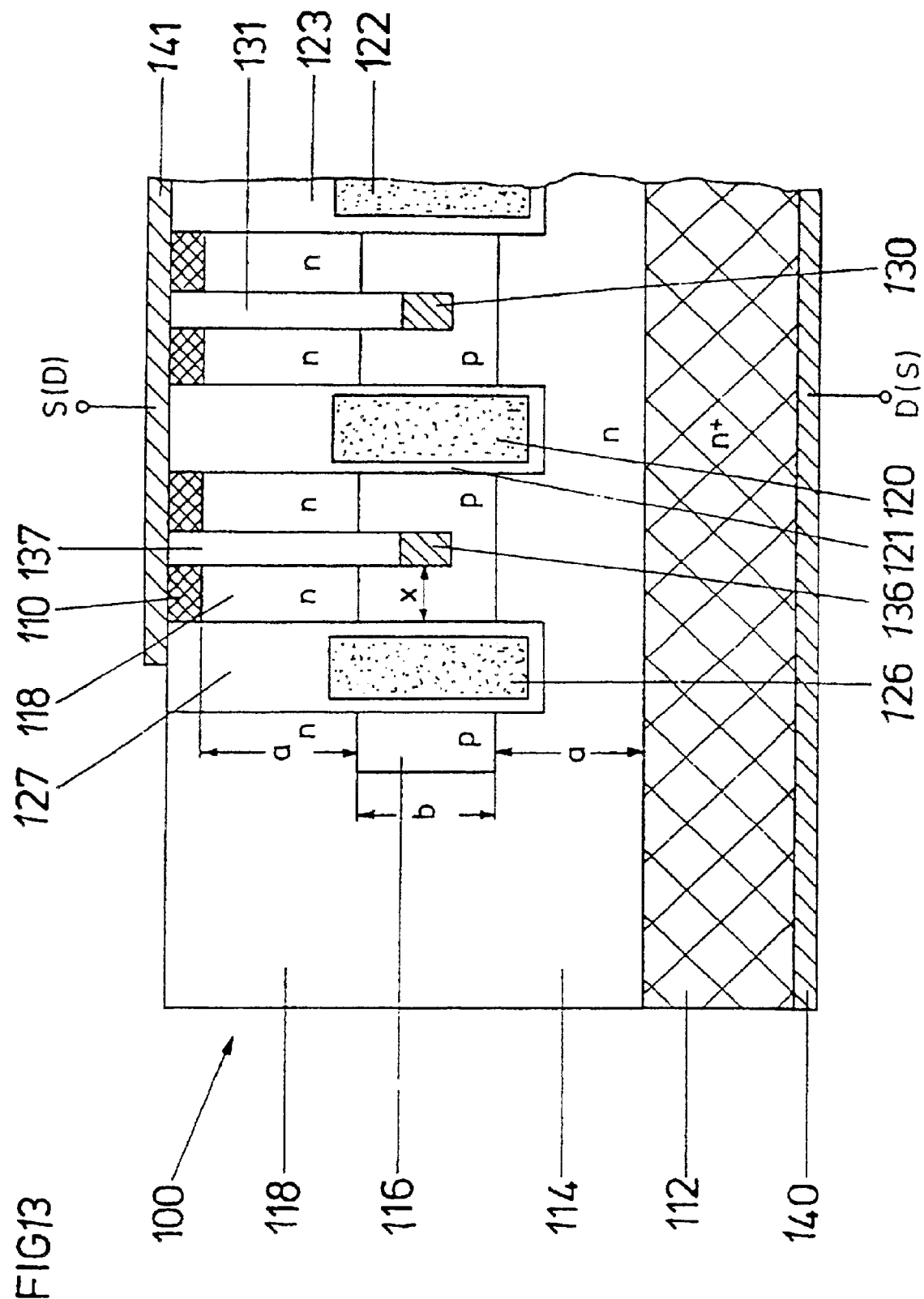
FIG. 13 shows a cross section through an edge region of the semiconductor switching element according to FIGS. 11 and 12 in side view.
Figure 14A:
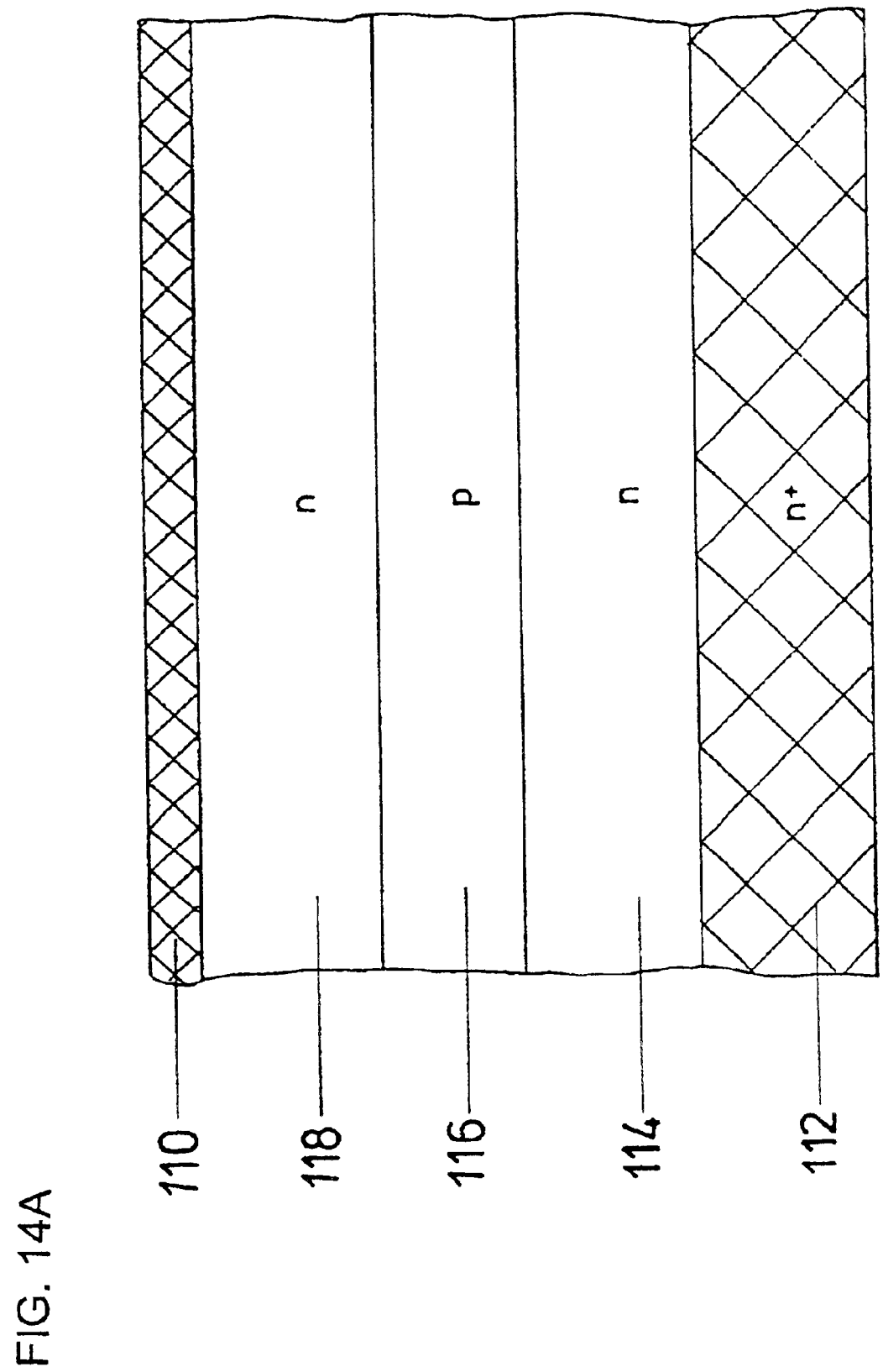
FIG. 14 shows a cross section through a semiconductor switching element according to FIGS. 11 and 12 during various method steps of the fabrication method.
Figure 14B:
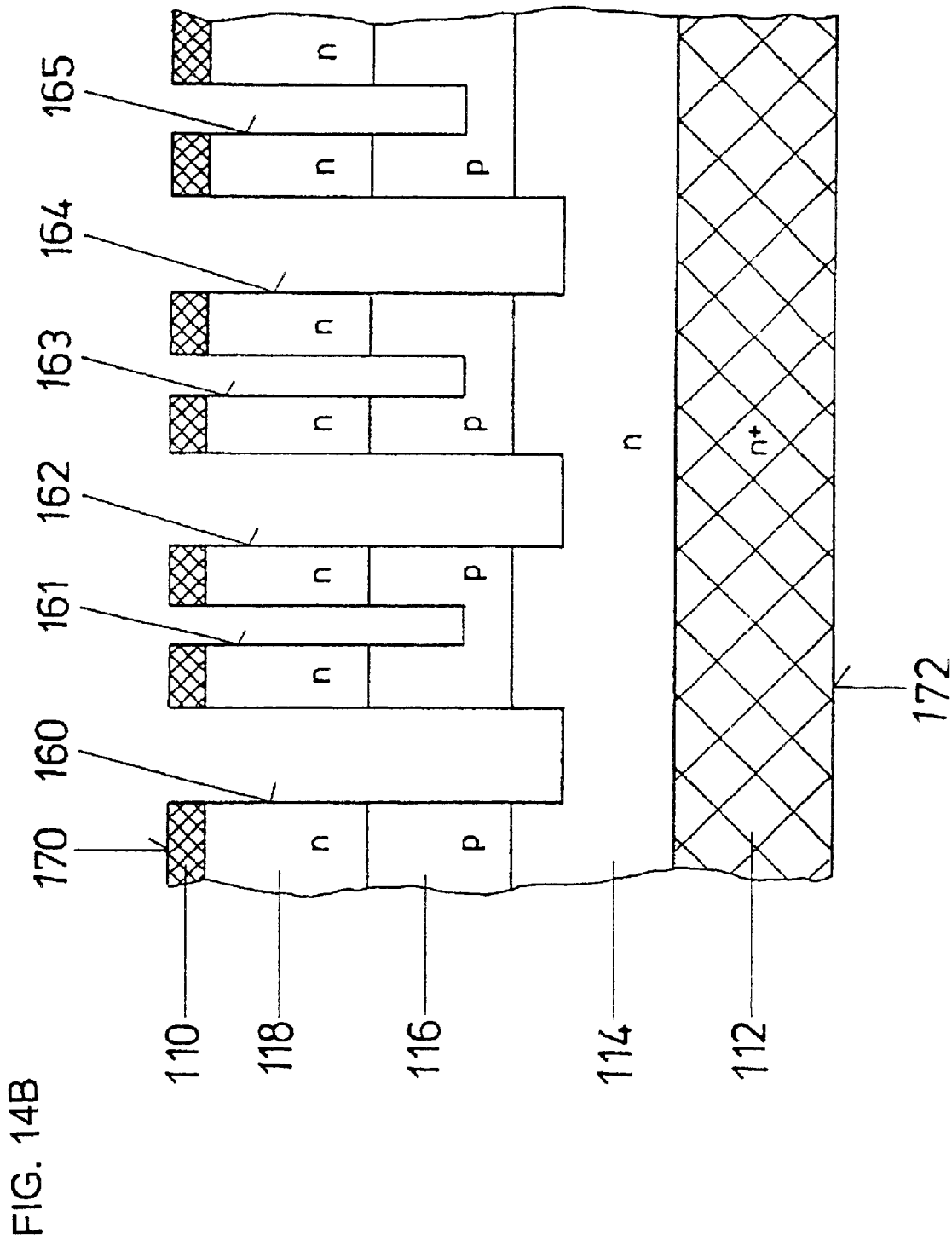
Figure 14C:
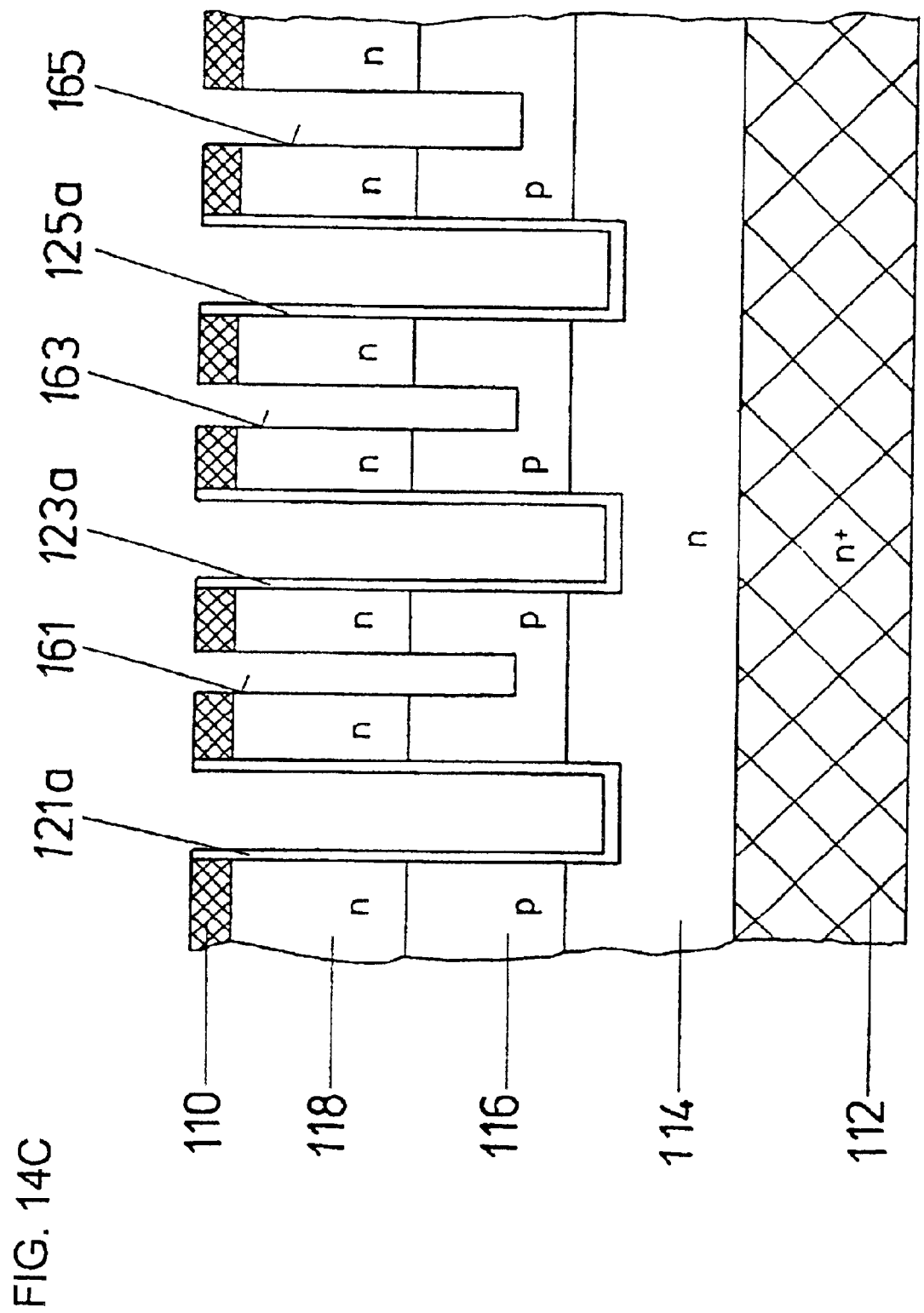
Figure 14D:
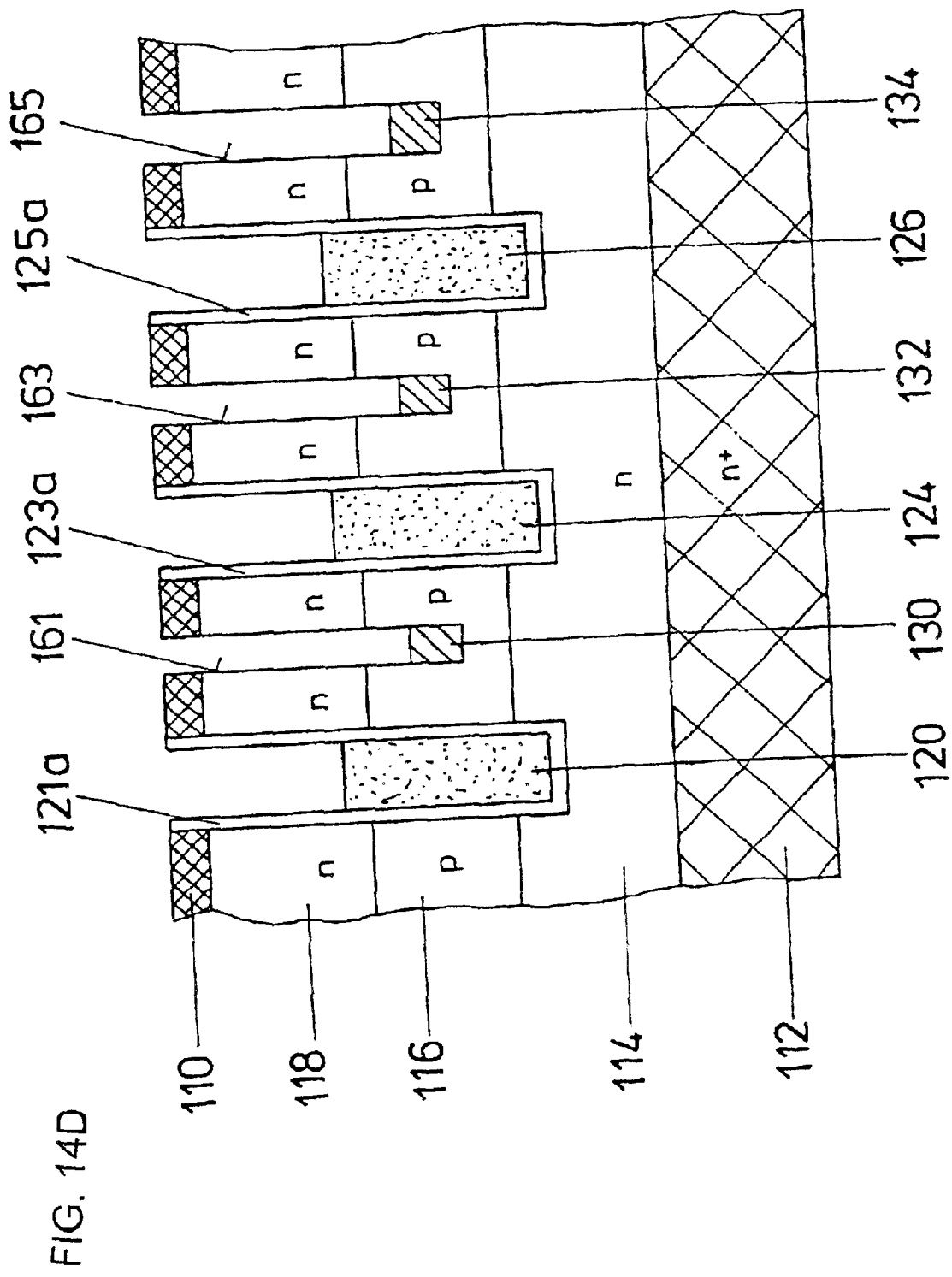

FIG. 13 shows an edge region of the semiconductor body 100 wherein the semiconductor switching element according to the invention is formed. As can be seen from FIG. 3, the channel zone 116 does not reach as far as the edge of the semiconductor body 100 in the lateral direction. Furthermore, in the lateral direction of the semiconductor body 100, the second terminal electrode 141 only reaches as far as a point above a control electrode 126 nearest to the edge. The second terminal zone 110 reaches only as far as that side of the insulation region 127 which is remote from the edge above the outermost control electrode 126. At that side area of the outermost control electrode 126 which faces the edge, it is thus not possible for a conductive channel to form between the first terminal zone 112 and the second terminal zone 110. The first transition zone 114 and the second transition zone 118 are connected to one another in the edge region.

If, in the semiconductor switching element according to the invention, a positive voltage is applied between the first terminal electrode (drain electrode) 140, D and the second terminal electrode (source electrode) 141, S, charge carriers, namely electrons and holes, are generated in a space charge zone between the drain zone 112, 114 and the channel zone. In this case, on account of the field in the space charge zone, the electrons flow into the drain zone 112, 114, or to the drain electrode 140, and the holes flow into the channel zone 116.

In the channel zone, the recombination zones 130, 132, 134, 136, preferably composed of a metal, promote the recombination of the holes injected into the channel zone with electrons. This prevents a parasitic bipolar transistor formed by the sequence of the n-conducting drain zone 112, 114, the p-conducting channel zone 116 and the n-conducting source zone 118, 110 from becoming active and reducing the reverse voltage of the MOSFET in the drain-source direction.

If, in addition to the drain-source voltage, a positive drive potential is applied to the control electrodes 120, 122, 124, 126, conductive channels form along the control electrodes 120, 122, 124, 126 and enable a charge carrier exchange between the drain zone 112, 114 and the source zone 110, 118.

The dielectric strength of the MOSFET in the drain-source direction is crucially determined by the doping of the second transition zone 114 and the "thickness" of the second transition zone 114, that is to say the distance between the heavily doped second terminal zone 112 and the channel zone 116.

When a positive voltage is applied in the source-drain direction, charge carriers are generated in a space charge zone between the second transition zone 118 and the channel zone 116, holes being injected into the channel zone 116, where they recombine with electrons at the recombination zones 130, 132, 134, 136, whereby the parasitic bipolar transistor is prevented from becoming active. The dielectric strength of the component in the source-drain direction is crucially determined by the doping of the first transition zone 118 and the distance between the heavily doped first terminal zone 110 and the channel zone 116.

The component according to the invention blocks in both directions, that is to say both in the drain-source direction and in the source-drain direction. Preferably, the first and second transition zones 114, 118 are doped identically and have the same layer thickness in order to obtain the same reverse voltage in the drain-source direction and in the source-drain direction. In contrast to the semiconductor switching elements in accordance with FIGS. 1 to 8, wherein only a heavily n-doped zone is present as source zone, and wherein the reverse voltage is larger in the drain-source direction than in the source-drain direction, in the circuit arrangement in accordance with FIGS. 11 to 13, identical reverse voltages can thus be achieved in the drain-source direction and in the source-drain direction.

Given fabrication of the component using silicon technology and given a thickness a of the channel zone of between 0.5 µm and 1 µm and a thickness b of the first and second transition zones 114, 118 of about 5 µm, it is possible, given a weak doping of these zones 14, 18, to obtain reverse voltages of about 50 V.

The distance x between the recombination zones and the control electrodes is preferably less than 1 µm.

FIG. 14 illustrates a method for fabricating a semiconductor switching element according to the invention. In this case, in first method steps (FIG. 14A), a semiconductor body 100 is fabricated, which has a heavily n-doped second terminal zone 112 and a more weakly n-doped second transition zone 114 arranged adjacent to the second terminal zone. In the semiconductor body 100, a p-doped channel zone 116 is formed adjacent to the second transition zone 114, said channel zone being adjoined by an n-doped first transition zone 118. The first transition zone 118 is doped more weakly than a heavily n-doped first terminal zone 110 arranged adjacent to the first transition zone 118.

In a next method step (FIG. 14B), first trenches 160, 162, 164 are produced which, proceeding from a front side 170 of the semiconductor body 100, extend right into the second transition zone 114. As an alternative, the trenches can be produced in such a way that, proceeding from the rear side 172 of the semiconductor body 100, they extend right into the first transition zone 118. Moreover, second trenches 161, 163, 165 which, proceeding from the front side 170, extend right into the channel zone 116 are produced adjacent to the first trenches 160, 162, 164. As an alternative, the second trenches, proceeding from the rear side 172, may extend right into the channel zone 116.

In a next method step (FIG. 14C), a layer 121a, 123a, 125a made of an insulation material is fabricated on side areas of the first trenches 160, 162, 164, in order to insulate the later electrodes 120, 122, 124 from the semiconductor body 100.

In next method steps, in order to fabricate the control electrodes 120, 124, 126, a layer made of electrode material is deposited in the first trenches 160, 162, 164, the layer reaching right into the first transition zone 118 in the vertical height of the semiconductor body 100. Moreover, a layer made of a recombination material is deposited in the second trenches 161, 163, 165, which layer extends to a point below the boundary with respect to the second transition zone 118 in the vertical height of the semiconductor body, so that the resultant recombination zones 130, 132, 114 are only surrounded by the channel zone 116.

In next method steps, the first and second trenches are filled with an insulation material before the terminal electrodes 140, 141 are applied to the front and rear sides 170, 172 of the semiconductor body, in order to arrive at the configuration illustrated in FIG. 11.

I claim:

1. A controllable semiconductor switching element, comprising:
    a first conduction zone and a second conduction zone of a first conductivity type;
    a channel zone of a second conductivity type between said first and second conduction zones;
    a control electrode insulated from said channel zone;
    said second conduction zone having a more heavily doped second terminal zone for connection to a terminal electrode and a more weakly doped second transition zone adjacent said channel zone;
    said first conduction zone having a more heavily doped first terminal zone for connection to a terminal electrode and a more weakly doped first transition zone adjacent said channel zone; and
    at least one recombination region disposed in said channel zone and made of a material promoting a recombination of charge carriers of the first and second conductivity types, the material of said recombination region being a material selected from the group consisting of metal, silicide and polysilicon.

2. The semiconductor switching element according to claim 1, wherein said recombination region is formed as a plate.

3. The semiconductor switching element according to claim 1, wherein said recombination region is one of a plurality of recombination regions formed in said channel zone.

4. The semiconductor switching element according to claim 3, wherein said recombination regions are formed in substantially parallel strips.

5. The semiconductor switching element according to claim 1, wherein said recombination region is completely surrounded by said channel zone.

6. The semiconductor switching element according to claim 1, which further comprises a zone of the first conductivity type arranged between said recombination region and said first conduction zone.

7. The semiconductor switching element according to claim 6, wherein said zone of the first conductivity type is doped more weakly than said first conduction zone.

8. The semiconductor switching element according to claim 1, wherein said first conduction zone, said depletion zone, and said second conduction zone are disposed in layers one above the other.

9. The semiconductor switching element according to claim 8, wherein said first and second transition zones of said first and second conduction zones have a substantially identical layer thickness.

10. The semiconductor switching element according to claim 1, wherein said first and second transition zones have at least an approximately equal doping concentration.

11. The semiconductor switching element according to claim 1, wherein a distance between said at least one recombination zone and said control electrode is small in relation to a thickness of said first and second transition zones.

12. The semiconductor switching element according to claim 1, wherein a distance between said at least one recombination zone and said control electrode is less than 1 $\mu$m.

* * * * *